US005128999A

United States Patent [19]

Yanagawa

[11] Patent Number: 5,128,999

[45] Date of Patent: Jul. 7, 1992

[54] SOUND FIELD CORRECTING APPARATUS

[75] Inventor: Hirofumi Yanagawa, Tokyo, Japan

[73] Assignee: Pioneer Electronic Corporation, Tokyo, Japan

[21] Appl. No.: 693,685

[22] Filed: Apr. 30, 1991

[30] Foreign Application Priority Data

Oct. 29, 1990 [JP] Japan .................................. 2-291347

[51] Int. Cl.5 .......................... H04S 3/00; H03G 3/00

[52] U.S. Cl. ........................................ 381/22; 381/63

[58] Field of Search ........................ 381/1, 181, 22, 24, 381/63

[56] References Cited

U.S. PATENT DOCUMENTS 4,696,036 9/1987 Julstrom .............................. 381/22

4,799,260 1/1987 Mandell et al. ....................... 381/22

*Primary Examiner*—Forester W. Isen

*Attorney, Agent, or Firm*—Perman & Green

[57] ABSTRACT

There is disclosed a sound field correcting apparatus for adding indirect sound signals to audio signals from a decoder when a steering emphasis operation is not executed in a decoder and for limiting the addition of the indirect sound signals when the steering emphasis operation has been performed by the decoder. Thus, a reproduction sound having a proper extent feeling and a movement feeling of a sound image is obtained in accordance with a scene of a video image.

5 Claims, 3 Drawing Sheets

PRIOR ART

PRIOR ART

SOUND FIELD CORRECTING APPARATUS

BACKGROUND OF THE INVENTION

1. Field of the Invention

The present invention relates to a sound field correcting apparatus which is connected to an output of a decoder to reconstruct audio signals of a plurality of channels from audio signals of two channels.

2. Description of the Related Art

There has been known a decoder to produce audio signals of a right channel, a left channel, a center channel, and a rear channel from audio signals of two channels. The audio signals of the two channels have been formed by an encoder such as an MP (motion picture) matrix encoder or the like.

In the decoder, for instance, the audio signals of two channels comprising an L total ($L_t$) output component and an R total ($R_t$) output component which are obtained by the MP matrix encoder are reconstructed to audio signals of four systems. However, even if the matrix process executed by the encoder is resolved as it is, enough separation is not derived. Therefore, there is a decoder using a steering emphasis technique to apply an emphasis proportional to an intensity to a preferential direction in consideration of a sound field priority in order to sharply localize a sound image in a desired direction and to obtain a stereophonic feeling. For example, a Dolby pro logic decoder has been known. To emphasize the steering, it is necessary that the sound which responds to the orientation is selected. When such a sound is defined as a dominant sound, the dominant sound can be summarized as a most conspicuous sound in the mixing at a certain moment. It is considered that the dominant sound to discriminate a subjective separation comes from one direction at a time. A capability such that the listener can hear and distinguish the orientations of the other inferior sounds at that moment is limited by the dominant sound. On the other hand, in the case where the audio signals are reproduced by a similar sound volume such that two or more sound cannot be simultaneously masked, a separating process is unnecessary, so that it is also unnecessary that the steering emphasis to improve the localization operates.

In the Dolby pro logic decoder, a preferential value is detected. Since the dominant sound can be resolved into coordinate numerical values by an LR axis and a CS axis which perpendicularly cross each other even if the dominant sound exists in any vector direction of 360°, the steering emphasis is independently detected every axis.

The Dolby pro logic decoder has been disclosed in detail in "JAS Journal", Japan Audio Society, pages 22-26, May, 1989.

There has also been proposed a sound field correcting apparatus for falsely obtaining a presence as in a theater by adding reflection sound signals to the audio signals of right and left channels R and L, a center channel C, and a rear channel S which are generated from the decoder as mentioned above.

However, in such a sound field correcting apparatus, if the reflection sound signals are added, a sound image which has been localized by executing the steering emphasis in the decoder becomes dull. Thus, there are problems such that a large extent feeling cannot be obtained and a proper extent feeling and a sound image movement cannot be derived as a reproduction sound for a video image such as a movie or the like.

SUMMARY OF THE INVENTION

It is an object of the invention to provide a sound field correcting apparatus which can obtain proper extent feeling and sound image movement as a reproduction sound for a video image.

According to the invention, there is provided a sound field correcting apparatus which is connected to outputs of a decoder for generating audio signals of front right and left channels, a center channel, and a rear channel from audio signals of two channels, for detecting a time point to execute a steering emphasis from the audio signal of each of the channels, and for executing a steering emphasis process to the audio signals of the respective channels, wherein the apparatus includes indirect sound adding means for adding indirect sound signals to the audio signals of at least the front right and left channels from the decoder, and the indirect sound adding means limits the addition of the indirect sounds in accordance with the steering emphasis detection signal.

According to the sound field correcting apparatus of the invention, in the case where the steering emphasis operation is not executed in the decoder, the indirect sound signals are added to the audio signals from the decoder, and in the case where the steering emphasis operation has been performed by the decoder, the addition of the indirect sound signal is limited, so that a reproduction sound having a proper extent feeling and a movement feeling of a sound image is obtained in accordance with a scene of a video image.

DETAILED DESCRIPTION OF A PREFERRED EMBODIMENT

An embodiment of the invention will be described in detail hereinbelow with reference to the drawings.

Figure 1:
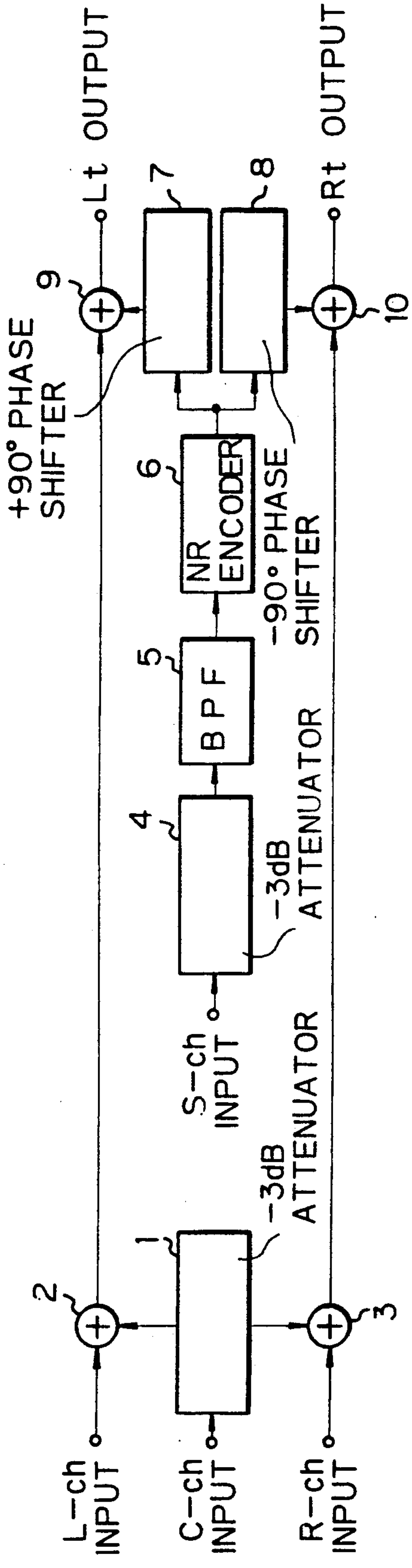
FIG. 1 is a block diagram showing a construction of an MP matrix encoder.

First, FIG. 1 shows a construction of an MP matrix encoder. After an audio signal of the center channel was level attenuated by a −3 dB attenuator 1, it is added to audio signals of the left and right channels by adders 2 and 3. After an audio signal of the surround channel as a rear channel was level attenuated by a −3 dB attenuator 4, it is frequency band limited to a range, for instance, from 100 Hz to 7 kHz by a BPF 5. The signal which has passed through the BPF 5 is supplied to a +90° phase shifter 7 and a −90° phase shifter 6 through an NR (noise reduction) encoder 6, so that a phase difference of 180° occurs between output signals of the phase shifters 7 and 8. The output signal of the +90° phase shifter 7 is added to an output signal of the adder 2 by an adder 9, so that an L total ($L_t$) output component is obtained. The output signal of the −90° phase shifter 8 is added to an output signal of the adder 3 by an adder 10, so that an R total ($R_t$) output component is derived.

Figure 2:
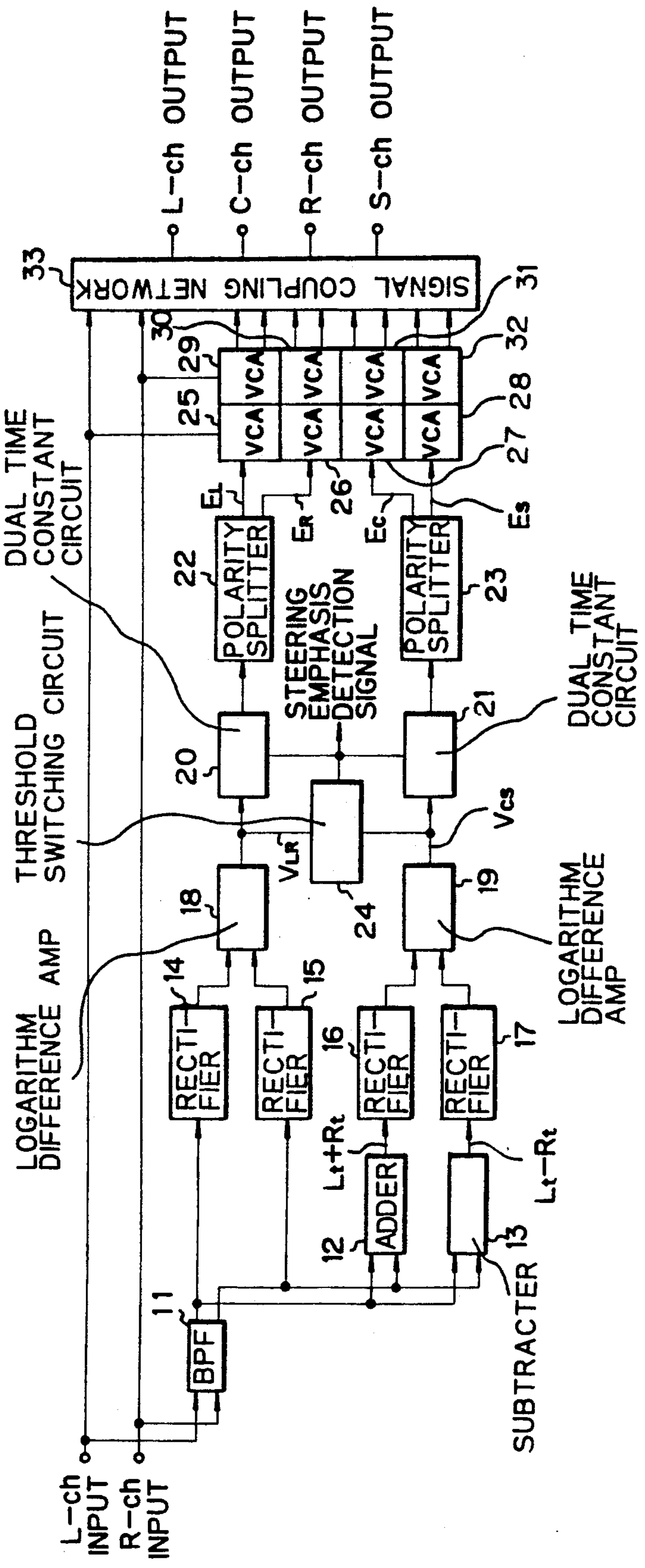
FIG. 2 is a block diagram showing a construction of a Dolby pro logic decoder.

FIG. 2 shows a construction of a Dolby pro logic decoder. In the decoder, the $L_t$ component signal and the $R_t$ component signal which are supplied are transmitted to a BPF 11, by which noise components and the like other than the effective band components are eliminated. The $L_t$ and $R_t$ component signals generated from the BPF 11 are supplied to an adder 12 and a subtracter 13, so that an $(L_t+R_t)$ signal and an $(L_t-R_t)$ signal are formed. The $L_t$ and $R_t$ component signals generated from the BPF 11, the $(L_t+R_t)$ signal, and the $(L_t-R_t)$ signal are full-wave rectified by rectifiers 14 to 17, respectively. Output DC voltages of the rectifiers 14 and 15 regarding an LR axis are supplied to a logarithm difference amplifier 18, by which a difference between the logarithm values of those voltages is detected and a control signal VLR is obtained. Similarly, output DC voltages of the rectifiers 16 and 17 regarding a CS axis are supplied to a logarithm difference amplifier 19, by which a difference between the logarithm values of those voltages is detected and a control signal VCS is derived. It is regarded that the control signals VLR and VCS indicate numerical values which reflect a direction discrimination performance of the sound which is listened by the ears. The control signals VLR and VCS are transmitted through dual time constant circuits 20 and 21 and polarity splitters 22 and 23 and drive VCAs 25 to 32. A threshold switching circuit 24 discriminates whether the levels of the control signals VLR and VCS have exceeded a threshold level or not. Time constants of the dual time constant circuits 20 and 21 are switched in accordance with an output of the threshold switching circuit 24. That is, if either one of the levels of the control signals VLR and VCS has exceeded the threshold level, a relative priority is high, so that the operating mode is set into a high speed operating mode so as to respond individual signal peaks. If they are lower than the threshold level, a low speed operating mode is set. The polarity splitter 22 splits a control signal VLR of bipolarities into control signals $E_L$ and $E_R$ each having a monopolarity. The polarity splitter 23 splits the control signal VCS of bipolarities into control signals $E_C$ and $E_S$ each having a monopolarity. The input Lt component signal is supplied to the VCAs 25 to 28. The input $R_t$ component signal is supplied to the VCAs 29 to 32. The VCAs 25 and 29 are controlled by the control signal $E_L$. The VCAs 26 and 30 are controlled by the control signal $E_R$. The VCAs 27 and 31 are controlled by the control signal $E_C$. The VCAs 28 and 32 are controlled by the control signal $E_S$. A signal Coupling network 33 is connected to outputs of the VCAs 25 to 33. The input $L_t$ component signal and the input $R_t$ component signal are also supplied to the signal coupling network 33. The network 33 generates decoding output signals L, R, C, and S by adding and subtracting ten kinds of input signals in accordance with preset proportion coefficients.

Figure 3:
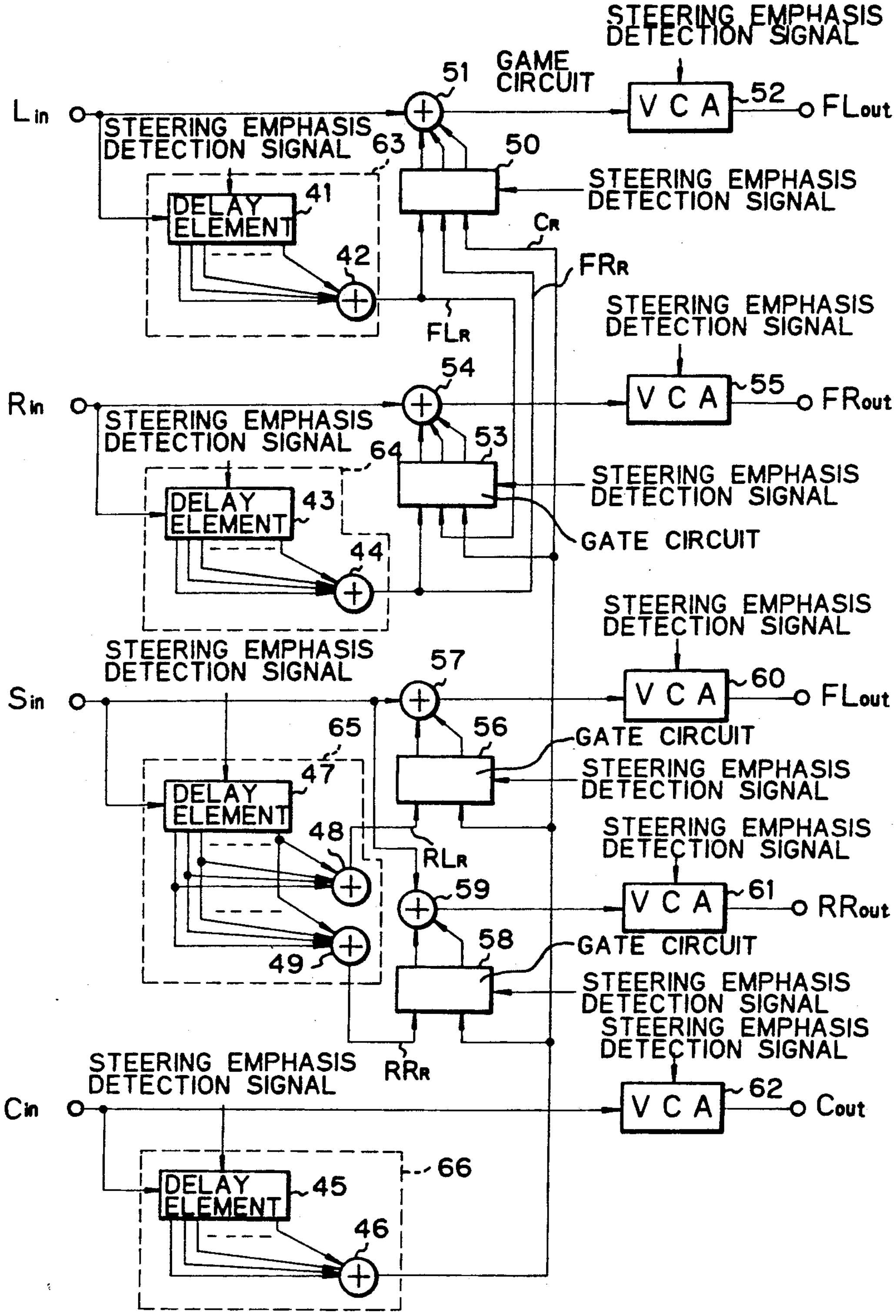
FIG. 3 is a block diagram showing an embodiment of the invention.

A sound field correcting apparatus according to the invention shown in FIG. 3 is connected to output terminals of the decoder shown in FIG. 2. Therefore, the sound field correcting apparatus has input terminals of the left and right channels L and R, the center channel C, and the rear channel S. A delay element 41 is connected to the input terminal of the left channel L. The delay element 41 has a plurality of output terminals and gives a plurality of different delay times to the audio signal and generates the delayed audio signals from the output terminals. The delay times are controlled in accordance with the steering emphasis detection signal as a control signal which is supplied to the control terminal. An adder 42 is connected to the output terminals of the delay element 41. The adder 42 adds the delayed audio signals which are generated from the delay element 41. The delay element 41 and the adder 42 construct an initial reflection sound generator 63. The levels can be also adjusted by inserting multipliers between the output terminals of the delay elements 41 and the adder 42, respectively.

In a manner similar to the left channel, initial reflection sound generators 64 and 66 comprising delay elements 43 and 45 and adders 44 and 46 are also connected to the input terminals of the right channel R and the center channel C. An initial reflection sound generator 65 comprising a delay element 47 and two adders 48 and 49 is also connected to the input terminal of the rear channel S. The adders 48 and 49 add the delayed audio signals which are generated from the delay element 47 and generates two initial reflection sound signals. It is not always necessary for the adders 48 and 49 to add the same plurality of delayed audio signals.

Output signals of the adders 42, 44, and 46 are supplied to an adder 51 through a gate circuit 50. The audio signal from the input terminal of the left channel is also directly supplied to the adder 51. A VCA 52 is connected to an output terminal of the adder 51. An output terminal of the VCA 52 is used as an output terminal of the front left channel. The on/off operations of the input and outputs of the gate circuit 50 and a gain of VCA 52 are controlled in accordance with the steering emphasis detection signal.

The right channel R is also provided with a gate circuit 53, an adder 54, and a VCA 55 and is constructed in a manner similar to the left channel. An output terminal of the VCA 55 is used as an output terminal of the front right channel.

In the rear channel S, the output signals of the adders 46 and 48 are supplied to an adder 57 through a gate circuit 56. Output signals of the adders 46 and 49 are supplied to an adder 59 through a gate circuit 58. A VCA 60 is connected to an output terminal of the adder 57. An output terminal of the VCA 60 is used as an output terminal of the rear left channel. A VCA 61 is connected to an output terminal of the adder 59. An output terminal of the VCA 61 is used as an output terminal of the rear right channel. The on/off operations of the input and outputs of the gate circuits 56 and 58 and gains of VCAs 60 and 61 are controlled in accordance with the steering emphasis detection signal.

A VCA 62 is connected to an input terminal of the center channel C. A gain of VCA 62 is controlled in accordance with the steering emphasis detection signal. An output terminal of the VCA 62 is used as an output terminal of the center channel.

The steering emphasis detection signal is an output signal of the threshold switching circuit 24 in FIG. 2. The threshold switching circuit 24 discriminates the steering emphasis in the following manner.

A mean value $|\overline{L_t/R_t}|$ in a predetermined time of an $L_t/R_t$ signal which has been logarithm converted by the logarithm difference amplifier 18 and generated as a difference between the logarithm values is obtained.

When $$|\overline{L_t/R_t}|=1 \tag{1}$$

a mean value $|\overline{L_t+R_t}|/|\overline{L_t-R_t}|$ in a predetermined time of an $(L_t+R_t)/(L_t-R_t)$ signal which has been logarithm converted by the logarithm difference amplifier 19 and generated as a difference between the logarithm values is obtained.

When $$|\overline{L_t+R_t}|/|\overline{L_t-R_t}|>k_{ref} \quad (2)$$

it is determined that the steering has been emphasized. The steering emphasis detection signal is set to the high level.

If the equation (1) is satisfied and there is the following relation $$|\overline{L_t+R_t}|/|\overline{L_t-R_t}|=b \quad (3)$$

it is decided that the steering is not emphasized. The steering emphasis detection signal is set to the low level. $k_{ref}$ corresponds to the threshold level mentioned above.

In the sound field correcting apparatus according to the invention, the gate circuits 50, 53, 57, and 59 turn on the respective inputs and outputs in accordance with the steering emphasis detection signal when the steering emphasis operation is not performed in the decoder. Each of the delay times of the delay elements **4*i*, 43, 45, and 47 becomes relatively long in accordance with the steering emphasis detection signal. Each of the gains of the VCAs 52, 55, 60, 61, and 62** decreases in accordance with the steering emphasis detection signal.

The initial reflection sound generator 63 produces a reflection sound signal $FL_R$ for an input signal $L_{in}$ of the front left channel L. The initial reflection sound generator 64 produces a reflection sound signal $FR_R$ for an input signal $R_{in}$ of the front right channel R. The initial reflection sound generator 65 produces reflection sound signals $RR_R$ and $RL_R$ of the rear right/left channels from an input signal $S_{in}$ of the rear channel. The initial reflection sound generator 66 produces a reflection sound signal $C_R$ for an input signal $C_{in}$ of the center channel C.

When the steering emphasis operation is not performed, the input signal $L_{in}$ is directly supplied to the adder 51 and the reflection sound signals $FL_R$, $FR_R$, and $C_R$ are supplied through the gate circuit 50 and those supplied signals are added. An output signal of the adder 51 is gain controlled by the VCA 52 and becomes an output signal $FL_{out}$ to which the reflection sound of the front left channel FL has been added. An input signal $R_{in}$ is directly supplied to the adder 54 and the reflection sound signals $FL_R$, $FR_R$, and $C_R$ are also supplied through the gate circuit 53 and those supplied signals are added. An output signal of the adder 54 is gain controlled by the VCA 55 and becomes an output signal $FR_{out}$ to which the reflection sound of the front right channel FR has been added. The input signal $S_{in}$ is directly supplied to the adder 57 and the reflection sound signals $RL_R$ and $C_R$ are also supplied through the gate circuit 56 and those supplied signals are added. An output signal of the adder 57 is gain controlled by the VCA 60 and becomes an output signal $RL_{out}$ to which the reflection sound of the rear left channel RL has been added. The input signal $S_{in}$ is directly supplied to the adder 59 and the reflection sound signals $RR_R$ and $C_R$ are also supplied through the gate circuit 58 and those supplied signals are added. An output signal of the adder 59 is gain controlled by the VCA 61 and becomes an output signal $RR_{out}$ to which the reflection sound of the rear right channel RR has been added. The input signal $C_{in}$ of the center channel is gain controlled by the VCA 62 and becomes an output signal $C_{out}$ of the center channel as it is. Therefore, when the steering emphasis operation is not performed, an addition amount of the reflection sound increases and the delay time of the reflection sound increases, so that an extent feeling increases.

On the contrary, when the steering emphasis operation has been performed in the decoder, the gate circuits 50, 53, 57, and 59 turn off all of or parts of the respective inputs and outputs in accordance with the steering emphasis detection signal. Each of the delay times of the delay elements 41, 43, 45, and 47 becomes relatively short in accordance with the steering emphasis detection signal. Each of the gains of the VCAs 52, 55, 60, 61, and 62 increases in accordance with the steering emphasis detection signal.

Thus, the input signal $L_{in}$ is merely supplied to the adder 51 or, for instance, the reflection sound signal $FL_R$ is further supplied through the gate circuit 50 and is added. As mentioned above, the output signal of the adder 51 of only almost a direct sound signal is gain controlled by the VCA 52 and becomes the output signal $FL_{out}$ of the front left channel FL. The input signal $R_{in}$ is merely supplied to the adder 54 or, for example, the reflection sound signal $FR_R$ is further supplied through the gate circuit 53 and is added. Accordingly, the output signal of the adder 54 of only an almost direct sound signal is gain controlled by the VCA 55 and becomes the output signal $FR_{out}$ of the front right channel FR. The input signal $S_{in}$ is merely supplied to the adder 57 or, for instance, the reflection sound signal $RR_R$ is further supplied through the gate circuit 56 and is added. Therefore, the output signal of the adder 57 of an almost direct sound signal is gain controlled by the VCA 60 and becomes the output signal $RL_{out}$ of the rear left channel RL. The input signal $S_{in}$ is merely supplied to the adder 59 or, for instance, the reflection sound signal $RR_R$ is further supplied through the gate circuit 58 and is added. Therefore, the output signal of the adder 59 of only an almost direct sound signal is gain controlled by the VCA 61 and becomes the output signal $RR_{out}$ of the rear right channel RR. The input signal $C_{in}$ of the center channel is gain controlled by the VCA 62 and becomes the output signal $C_{out}$ of the center channel C as it is. Consequently, when the steering emphasis operation has been performed, an addition amount of the reflection sound is so small to be almost zero and the delay time of the reflection sound decreases, so that a sound image obtained by the steering emphasis operation is clearly localized.

In the above embodiment, the steering emphasis detection signal has directly been obtained from the output of the threshold switching circuit 24 of the decoder. However, the steering emphasis detection signal can be also obtained by individually providing a circuit on the basis of the foregoing discriminating method of the steering emphasis. The steering emphasis detection signal can be also obtained from the monopolarity control signals $E_L$, $E_R$, $E_C$, and $E_S$ which are generated from the polarity splitters 22 and 23 of the decoder in FIG. 2.

In the above embodiment, the indirect sound signals have been added to not only the front channel but also the rear channel. However, the indirect sound signals can be also added to only the front channel. Reverberation sound signals instead of the merely reflection sound signals can be also added as indirect sound signals to the rear channel.

In the above embodiment, further, the apparatus has been constructed by the elements such as delay elements, adders, VCAs, and the like in what is called a hardware manner. However, the apparatus can be also constructed by using a DSP (digital signal processor) in what is called a software manner.

As mentioned above, according to the sound field correcting apparatus of the invention, in the case where the steering emphasis operation is not performed in the decoder, the indirect sound signals are added to the audio signals from the decoder, so that a large extent feeling can be obtained. Contrarily, if the steering emphasis operation has been performed in the decoder, since the addition of the indirect sound signals is limited, a sound image obtained by the steering emphasis operation is fixedly oriented. Thus, a reproduction sound having a proper extent feeling and a movement feeling of a sound image is derived in accordance with a scene of a video image.

What is claimed is:

1. A sound field correcting apparatus which is connected to outputs of a decoder for generating audio signals of front right and left channels, a center channel, and a rear channel from audio signals of two channels, for detecting a time point to execute a steering emphasis from the audio signal of each of said channels, and for performing a steering emphasis process to the audio signals of said channels, wherein the apparatus includes indirect sound adding means for adding indirect sound signals to the audio signals of at least the front right and left channels from said decoder, and said indirect sound adding means limits the addition of said indirect sound signals in accordance with a steering emphasis detection signal.

2. An apparatus according to claim 1, wherein said indirect sound adding means produces reflection sound signals as said indirect sound signals by transmitting the audio signals of the respective channels through delay elements and decreases delay times of said delay elements in accordance with said steering emphasis detection signal.

3. An apparatus according to claim 1, wherein said indirect sound adding means stops the addition of said indirect sound signals to the audio signals from said decoder in accordance with said steering emphasis detection signal.

4. An apparatus according to claim 1, wherein said indirect sound adding means decreases addition amounts of the indirect sound signals to the audio signals from said decoder in accordance with said steering emphasis detection signal.

5. An apparatus according to claim 1, wherein said steering emphasis detection signal is obtained in said decoder.

* * * * *